United States Patent [19]

Toyonaga et al.

[11] Patent Number: 5,657,243

[45] Date of Patent: Aug. 12, 1997

[54] METHOD AND APPARATUS FOR AUTOMATICALLY ARRANGING CIRCUIT ELEMENTS IN DATA-PATH CIRCUIT

[75] Inventors: Masahiko Toyonaga, Hyogo; Michiaki Muraoka, Nara, both of Japan

[73] Assignee: Matsushita Electric Industrial Co., Ltd., Osaka, Japan

[21] Appl. No.: 510,673

[22] Filed: Aug. 3, 1995

[30] Foreign Application Priority Data

Aug. 4, 1994 [JP] Japan ................... 6-183242

[51] Int. Cl.⁶ ................................. G06F 17/50
[52] U.S. Cl. ........................... 364/491; 364/489
[58] Field of Search ...................... 364/488, 489, 364/490, 491

[56] References Cited

U.S. PATENT DOCUMENTS

| | | | |
|---|---|---|---|
| 4,641,247 | 2/1987 | Laugesen et al. | 364/490 |
| 5,239,465 | 8/1993 | Hattori et al. | 364/491 |
| 5,487,018 | 1/1996 | Loos et al. | 364/489 |
| 5,491,640 | 2/1996 | Sharma et al. | 364/488 |
| 5,493,506 | 2/1996 | Sakashita et al. | 364/489 |
| 5,586,047 | 12/1996 | Imahashi | 364/491 |

FOREIGN PATENT DOCUMENTS 3-77172  4/1991  Japan .

*Primary Examiner*—Vincent N. Trans
*Attorney, Agent, or Firm*—McDermott, Will & Emery

[57] ABSTRACT

An automatic layout of a data-path circuit, whose performance and area are optimized, requires to input a data-path circuit, produce an external terminal directive branch having a start point placed on an input terminal group of the data-path circuit and an end point placed on an output terminal group of the same, and produce in-circuit directive branches corresponding to respective connecting lines between two circuit elements in the data-path circuit, each in-circuit directive branch having a start point placed on one circuit element supplying a signal to a related connecting line and an end point placed on the other circuit element receiving the signal from the same connecting line. Subsequently, a group circuit is produced based on the relationship between the in-circuit directive branches and the circuit elements, the group circuit comprising a plurality of circuit elements performing a series of logic processing per 1-bit signal. A layout evaluation is then produced so as to comprise an evaluation satisfying a requirement that a direction of the external terminal directive branch is met with directions of the in-circuit directive branches. Thereafter, the layout of circuit elements is optimized based on the layout evaluation and the resultant layout is outputted.

8 Claims, 18 Drawing Sheets

10 DATA PATH LOGIC CIRCUIT

METHOD AND APPARATUS FOR AUTOMATICALLY ARRANGING CIRCUIT ELEMENTS IN DATA-PATH CIRCUIT

BACKGROUND OF THE INVENTION

The preset invention generally relates to a CAD method and CAD apparatus for aiding layout design of semiconductor integrated circuits such as VLSI, and more particularly to data-path automatic layout method and apparatus for automatically executing a layout design of a data-path logic circuit which performs arithmetic processing of data signals of plural bits.

Recently, manufacturing technologies for semiconductor integrated circuits have been greatly improved. Especially, nowadays development of fine machining technologies and multi-layer wiring technologies makes it feasible to mount more than 10 millions of transistors on a single chip. However, it was difficult for conventional design aid systems or design automation technologies using computers to accomplish circuit design of such a large-scale semiconductor integrated circuit, because time required for the computer to process design data increases with increasing number of logic elements to be designed, accompanied with deterioration of quality in the processing result.

A signal processing circuit is generally required to have high performance and small area. In designing a layout of such a signal processing circuit, a method of determining the layout based on an automatic layout technology is not used. The method having been normally adopted is rather to dispose each constituent element on a substrate so as to form the same layout as that of a logic circuit diagram, for example for the purpose of making great account of signal flow.

On the other hand, a data-path automatic layout method not relying on the arrangement of a logic circuit diagram is for example disclosed in the unexamined Japanese patent application No. 3-77172/1991, which comprises steps of designating bit information through manual operation, clustering bit slice elements based on this designation, and automatically obtaining a layout.

However, according to the conventional layout design method directly copying the layout of the logic circuit diagram, there is a possibility that a resultant layout is worsened in area efficiency because any areal correlation is not recognized between the constituent element of the logic circuit diagram (i.e. logic symbol) and the actual component handled in the layout.

A method of improving this drawback is for example a bit slice method which comprises steps of preparing a logic element unifying a series of arithmetic processes corresponding to a one-bit signal on a logic circuit diagram, preparing a physical element (cell) realizing these arithmetic processes, disposing logic elements as much as the number of bits of signals, and accomplishing the layout by superposing cells as much as the number of bits of signals so as to obtain a layout similar to that of the logic circuits. However, it is mandatorily required to prepare numerous kinds of cells so as to meet various circuits, which will cause a problem of increasing the manufacturing time.

More specifically, FIGS. 19A and 19B show exemplary layout results obtained according to the conventional data-path automatic layout method, while FIG. 20 shows an overall layout of a semiconductor integrated circuit realized by the conventional data-path automatic layout method. In these drawings, reference numeral 20 represents a data-path block, reference numeral 22 represents a dedicated cell, reference numeral 24 represents an input terminal, reference numeral 28 represents an output terminal, reference numeral 30 represents a semiconductor integrated circuit, reference numeral 32 represents a data-path wiring, and reference numeral 34 represents a peripheral circuit.

In such a conventional data-path automatic layout method, optimization of performance and area is feasible only when the bit number of signals is constant throughout the processing in the circuit as shown in FIG. 19A. If the bit number of signals is varied through the processing in the circuit as shown in FIG. 19B, it is not possible to obtain an effective layout. To solve this problem, it is necessary to newly develop dedicated elements in accordance with the given bit arrangement, which will inevitably require manual correction and possibly increase the entire cost for developing semiconductor integrated circuits.

Furthermore, as shown in FIGS. 19A and 19B, the positional relationship between input terminal 24 and output terminal 26 in the data-path block 20 is univocally or forcibly determined according to the given bit arrangement. For this reason, each data-path wiring 32 may be subjected to undesirable bending as shown in FIG. 20. Such a bending will worsen the performance and area efficiency when the semiconductor integrated circuit 30 is evaluated as a whole.

One method for disposing the terminals at desirable positions is an automatic layout method according to the standard cell method. However, the existing automatic layout methods are normally used for optimizing the wiring, and not applicable to the optimization of performance and area of data-path logic circuits.

SUMMARY OF THE INVENTION

Accordingly, in view of above-described problems encountered in the prior art, a principal object of the present invention is to provide a method and apparatus for automatically performing a data-path layout design capable of realizing a semiconductor integrated circuit excellent in performance and small in size.

The present invention makes it possible to automatically accomplish a data-path layout design capable of guaranteeing that arithmetic processes are speedy and accurate in order.

According to the present invention, a first directive branch is disposed so as to place its start point on an input terminal group of the data-path logic circuit and also place its end point on an output terminal group of the same circuit. Thus, it becomes possible to regulate the flow of signals in the data-path block. Furthermore, second directive branches are provided so as to have a start point placed on one circuit element in the data-path logic circuit and an end point placed on another circuit element in the same circuit. By the provision of these second directive branches, it becomes possible to automatically extract partial bit slice arrangements in the data-path logic circuit. Thus, in the layout of circuit element of the data-path logic circuit, various factors such as, wiring length and area, can be optimized under numerous restrictions.

When the first directive branch is produced, the first directive branch is located within a predetermined layout region in a convoluting manner, so as to meet the positions of input terminals and output terminals of the data-path logic circuit. This convoluting processing makes it feasible to flexibly change the flow of signals in accordance with the position of terminals. Accordingly, both the input terminals and output terminals are located at desirable positions. And, it becomes possible to automatically design a layout of the data-path circuit so as to reduce an entire area of the semiconductor integrated circuit.

When the second directive branch is produced, the circuit elements in the data-path logic circuit are developed into basic circuit elements. Thus, an area of each cell row can be uniformed, and an area of the data-path block can be reduced. Furthermore, a connecting line between basic circuit elements can be shortened primarily so as to prevent performance of circuit elements from being reduced. Accordingly, it becomes possible to automatically design a layout of the data-path circuit capable of improving area efficiency while maintaining performance of each arithmetic processing.

Still further, a plurality of circuit elements performing a series of logic processing per 1-bit signal are unified into one group to obtain partial bit slice arrangements. Thus, it becomes possible to automatically design a layout of the data-path circuit which is capable of simultaneously realizing the optimization of logic performance and optimization of area. In designing a circuit element group, circuit element groups each including plural circuit elements to be disposed adjacently are automatically extracted according to the flow of signals, not by the logic relationship between circuit element groups.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE INVENTION

Hereinafter, a preferred embodiment of the present invention will be explained in greater detail with reference to the accompanying drawings.

First explained hereinafter will be an arrangement of a data-path automatic layout apparatus in accordance with the embodiment of the present invention. The data-path automatic layout apparatus defined in the present embodiment is an apparatus for automatically producing a layout of a given data-path logic circuit.

Figure 1:
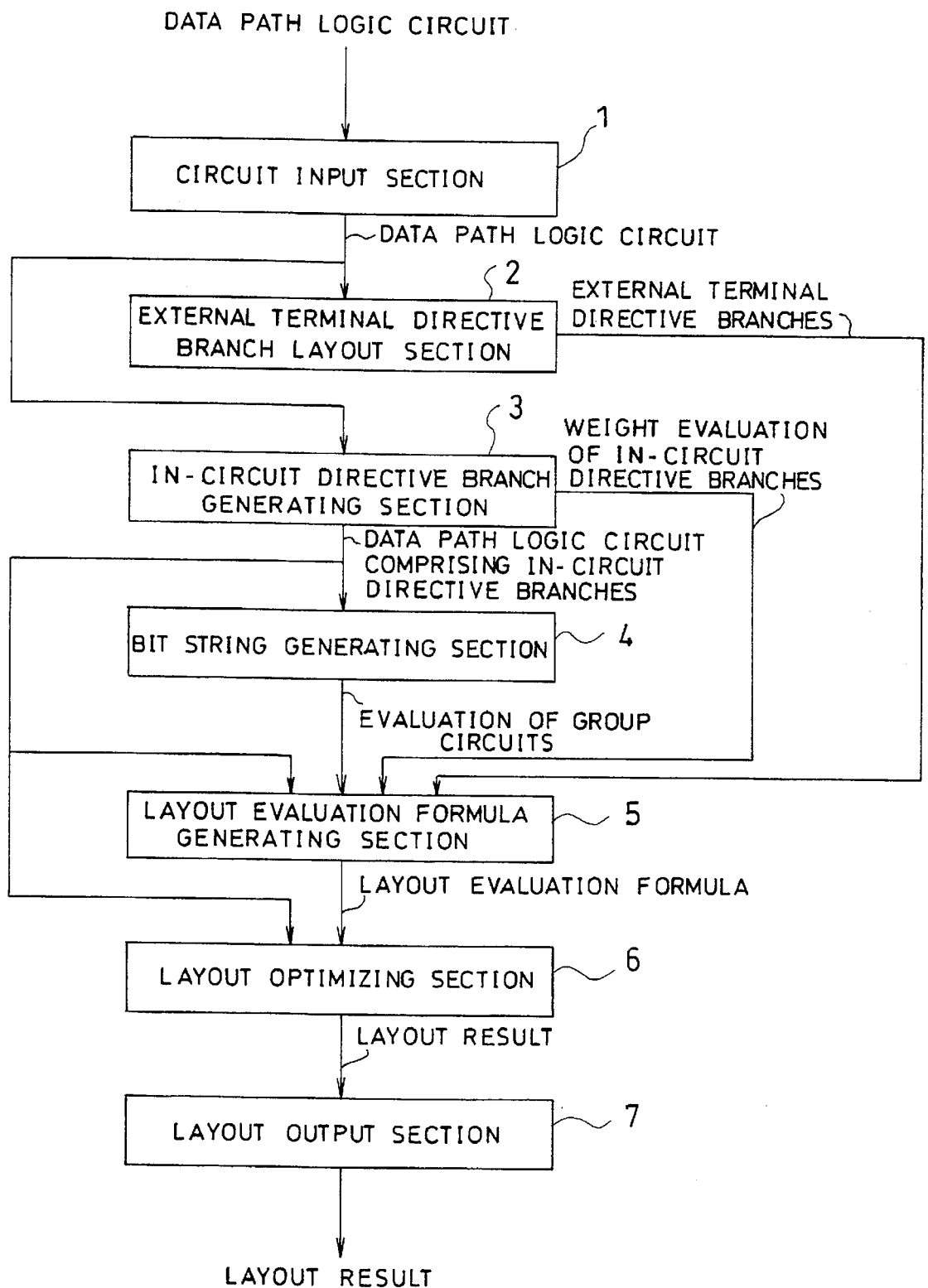
FIG. 1 is a block diagram showing a schematic arrangement of a data-path automatic layout apparatus in accordance with one embodiment of the present invention.

FIG. 1 is a block diagram showing a schematic arrangement of a data-path automatic layout apparatus in accordance with one embodiment of the present invention. In FIG. 1, reference numeral 1 represents a circuit input section serving as first means for inputting a data-path logic circuit which is arbitrarily given. Reference numeral 2 represents an external terminal directive branch layout section serving as second means for producing an external terminal directive branch having a start point placed on an input terminal group and an end point placed on an output terminal group in the data-path logic circuit, and for locating thus produced external terminal directive branch in a predetermined layout region.

Reference numeral 3 represents an in-circuit directive branch generating section serving as third means for producing in-circuit directive branches corresponding to respective connecting lines between any two circuit elements in the data-path logic circuit, each in-circuit directive branch having a start point placed on one circuit element supplying a signal to a related connecting line and an end point placed on the other circuit element receiving the signal from the same connecting line. Reference numeral 4 represents a bit string generating section serving as fourth means for producing a bit string comprising in-circuit directive branches produced from the in-circuit directive branch section 3.

Reference numeral 5 represents a layout evaluation formula generating section serving as fifth means for producing a layout evaluation formula. Reference numeral 6 represents a layout optimizing section serving as sixth means for optimizing a layout of circuit elements in a data-path logic circuit based on an obtained layout evaluation formula. Reference numeral 7 represents a layout output section serving as seventh means for outputting a layout result obtained through the optimization by the layout optimizing section 6.

Figure 2:
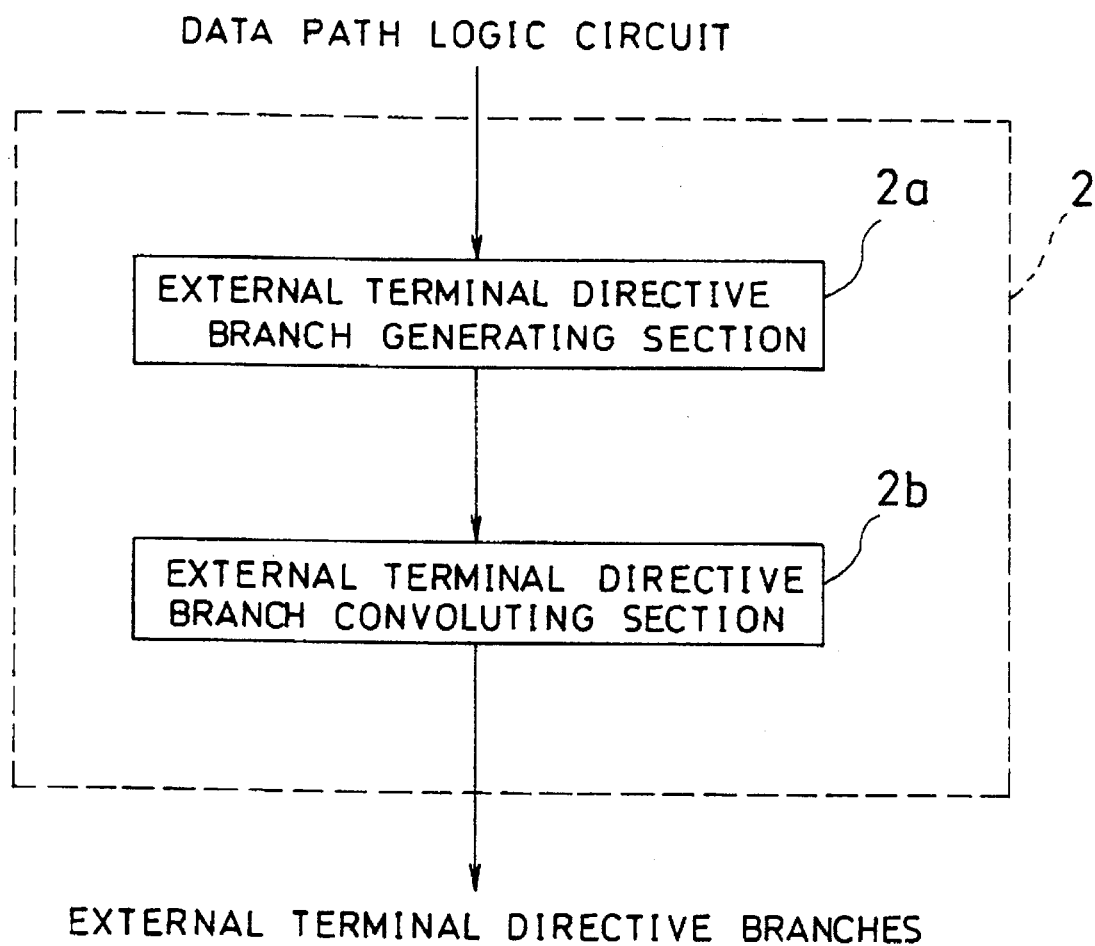
FIG. 2 is a block diagram showing a schematic arrangement of an external terminal directive branch layout section of the data-path automatic layout apparatus in accordance with the embodiment of the present invention.

FIG. 2 is a block diagram showing a schematic arrangement of the external terminal directive branch layout section 2. In FIG. 2, reference numeral 2a represents an external terminal directive branch generating section which produces an external terminal directive branch by putting a start point thereof on an input terminal group of the data-path logic circuit and an end point thereof on an output terminal group of the same data-path logic circuit. Reference numeral 2b represents an external terminal directive branch convoluting section which locates the external terminal directive branch within a predetermined layout region in a convoluting manner so that the input terminal group and the output terminal group are disposed at desired positions.

Figure 3:
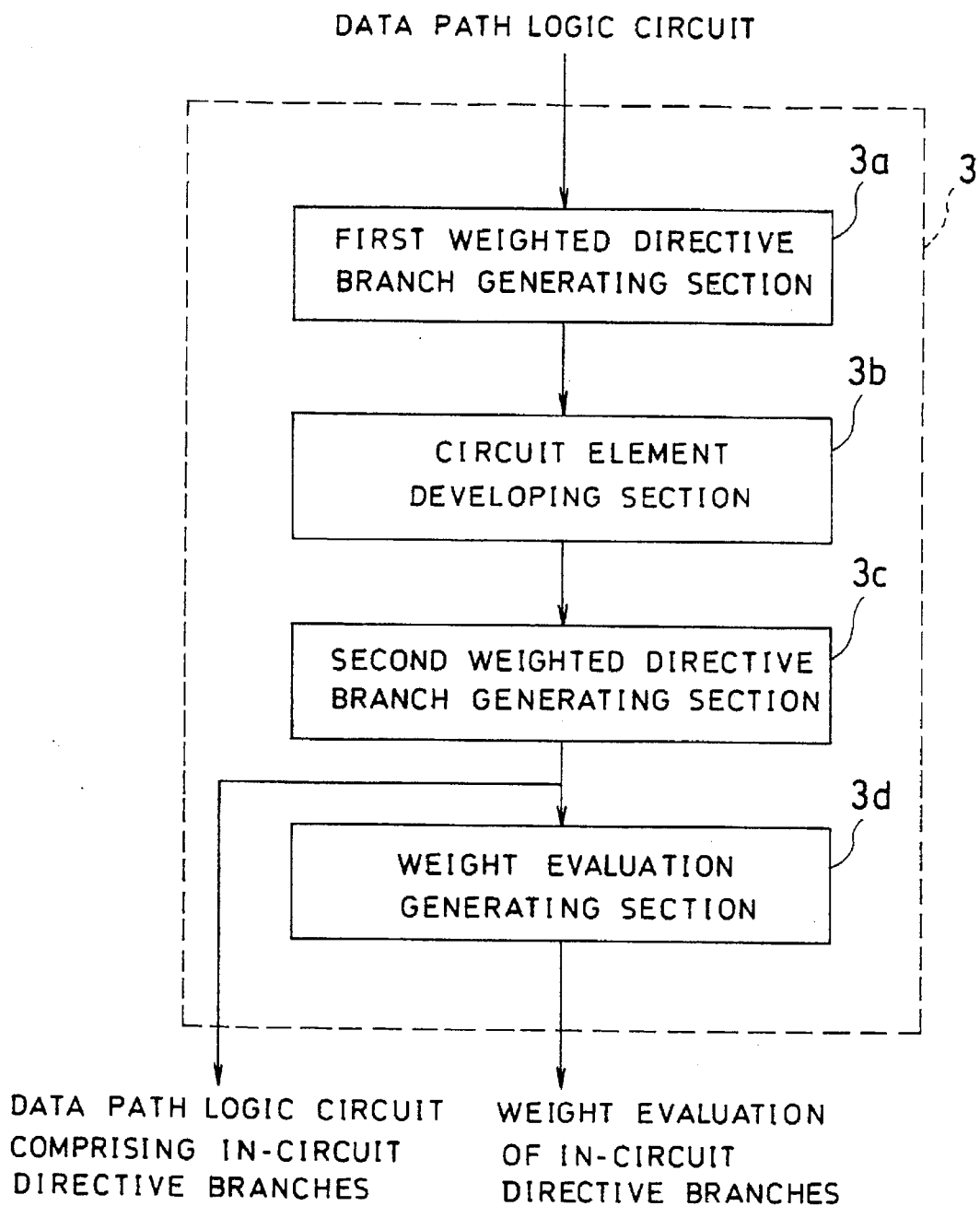
FIG. 3 is a block diagram showing a schematic arrangement of an in-circuit directive branch layout section of the data-path automatic layout apparatus in accordance with the embodiment of the present invention.

FIG. 3 is a block diagram showing a schematic arrangement of the in-circuit directive branch layout section 3. In FIG. 3, 3, reference numeral 3a represents a first weighted directive branch generating section which produces in-circuit directive branches weighted by W1, corresponding to respective connecting lines between any two circuit elements in the data-path logic circuit, each in-circuit directive branch having a start point placed on one circuit element supplying a signal to a related connecting line and an end point placed on the other circuit element receiving the signal from the same connecting line. Reference numeral 3b represents a circuit element developing section which develops a circuit element into basic circuit elements such as an AND circuit and an OR circuit.

Reference numeral 3c represents a second weighted directive branch generating section which produces in-circuit directive branches weighted by W2, corresponding to respective connecting lines between any two basic circuit elements in the data-path logic circuit, each in-circuit directive branch having a start point placed on one basic circuit element supplying a signal to a related connecting line and an end point placed on the other basic circuit element receiving the signal from the same connecting line. Reference numeral 3d represents a weight evaluation generating section which produces an evaluation for satisfying a requirement that a sum of lengths of in-circuit directive branches is minimized by taking account of the priority order based on the given weight.

Figure 4:
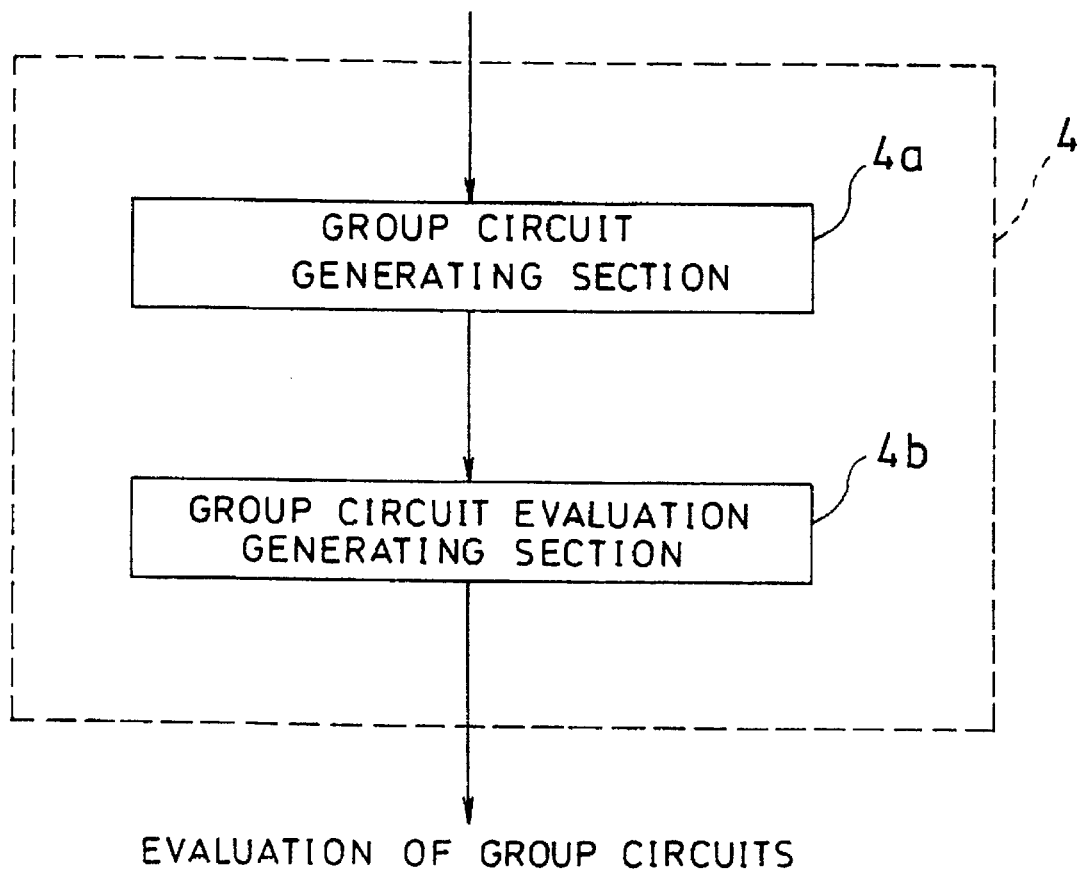
FIG. 4 is a block diagram showing a schematic arrangement of a bit string generating section of the data-path automatic layout apparatus in accordance with the embodiment of the present invention.

FIG. 4 is a block diagram showing a schematic arrangement of the bit string generating section 4. In FIG. 4, reference numeral 4a represents a group circuit generating section for searching pairs of circuit elements by which all the in-circuit directive branches having their start points on one circuit element or the like (including a basic circuit element) are completely met with all the in-circuit directive branches having their end points on the other circuit element or the like, and for constituting a group circuit of bit strings based on thus obtained pairs of the circuit elements or the like. Reference numeral 4b represents a group circuit evaluation generating section which produces an evaluation for satisfying a requirement that circuit elements or the like belonging to the same group circuit are disposed adjacently.

Next explained will be specific operations of the data-path automatic layout apparatus constituted as described above. In the following explanation, an input data is a data-path logic circuit 10 shown in FIG. 9. The data-path logic circuit 10 performs arithmetic processing of 4-bit data signals and generates 2-bit data signals.

Figure 5:
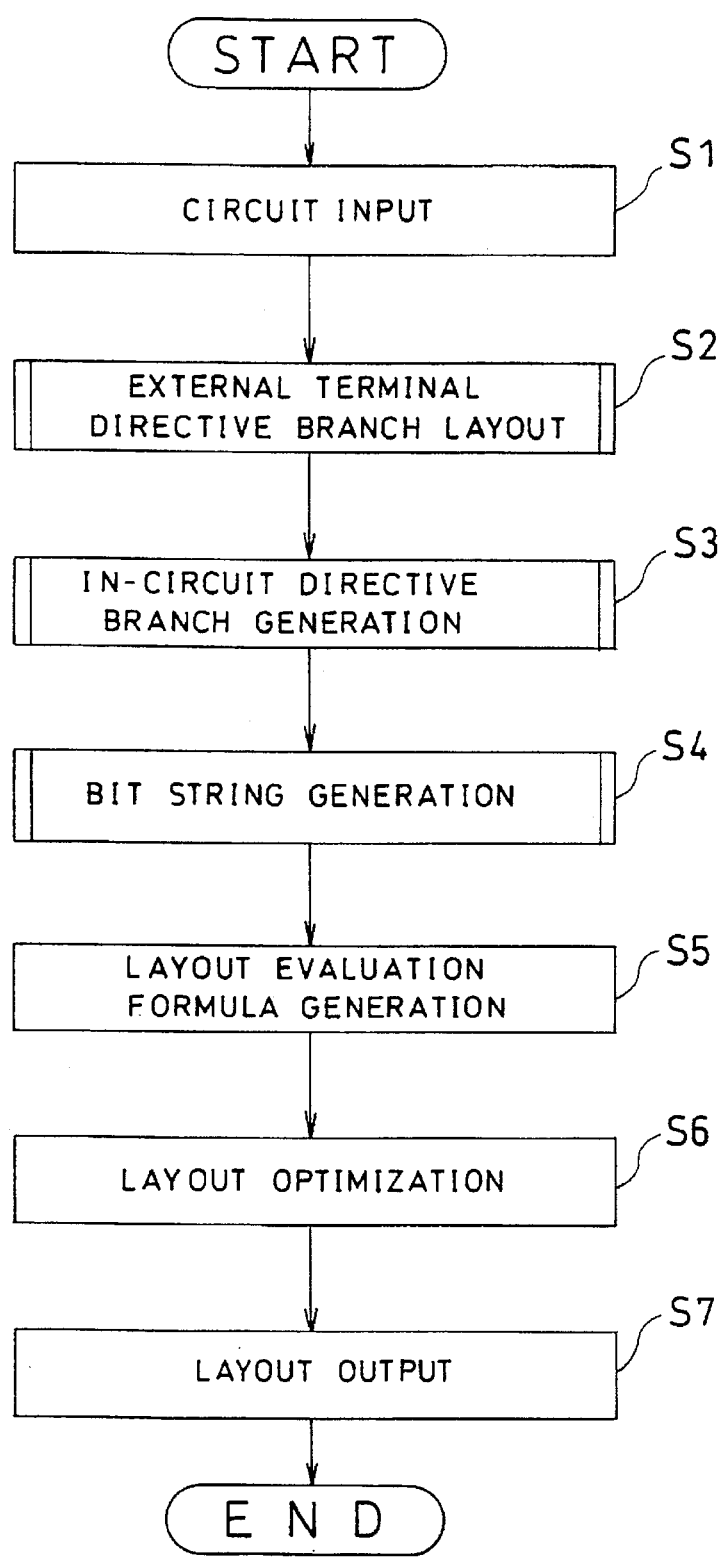
FIG. 5 is a flow chart showing details of a data-path automatic layout method realized by the data-path automatic layout apparatus in accordance with the embodiment of the present invention.

FIG. 5 is a flow chart showing details of the data-path automatic layout method realized by the data-path automatic layout apparatus in accordance with the embodiment of the present invention.

Figure 9:
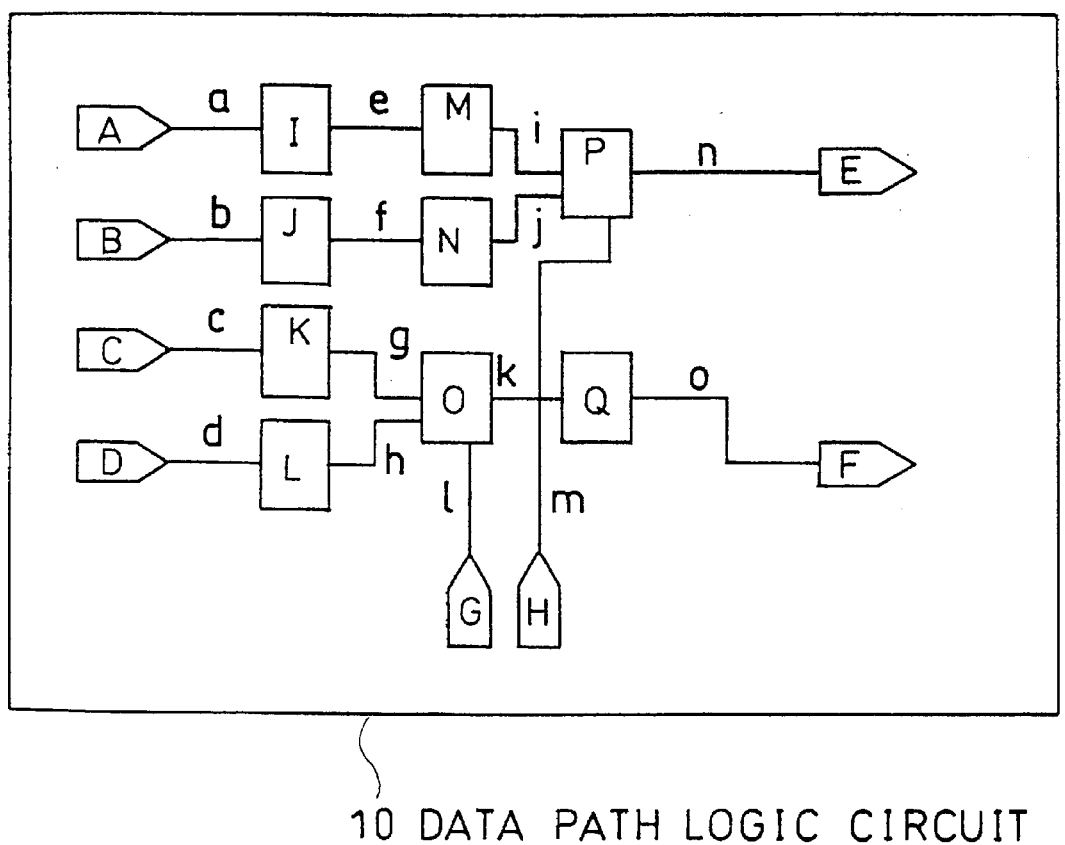
FIG. 9 is a view showing details of a data path logic circuit to be processed in a circuit input processing of the data-path automatic layout method in accordance with the embodiment of the present invention.

As shown in FIG. 5, first of all, in a circuit input processing (first processing) S1, the data-path logic circuit is read in. As described above, details of this data-path logic circuit is shown in FIG. 9. The data-path logic circuit 10 comprises input terminals A through D, output terminals E and F, control terminals G and H, circuit elements I through Q and connecting lines "a" through "o".

Figure 6:
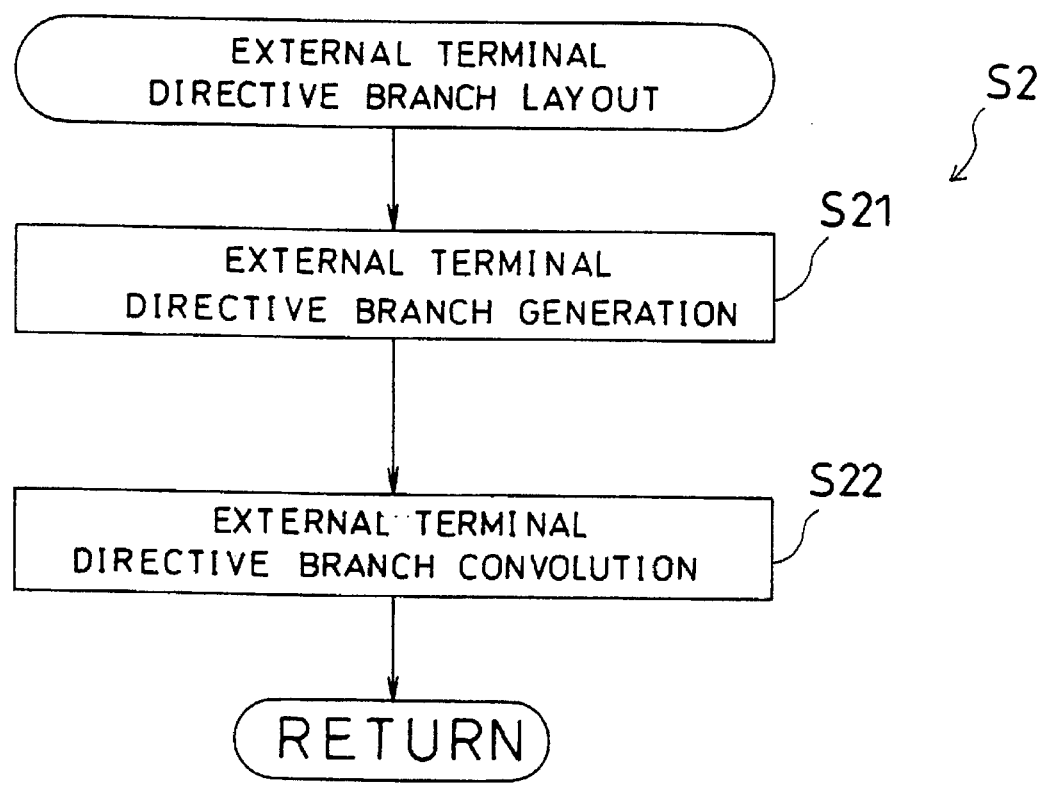
FIG. 6 is a flow chart showing details of an external terminal directive branch layout processing of the data-path automatic layout method in accordance with the embodiment of the present invention.
Figure 7:
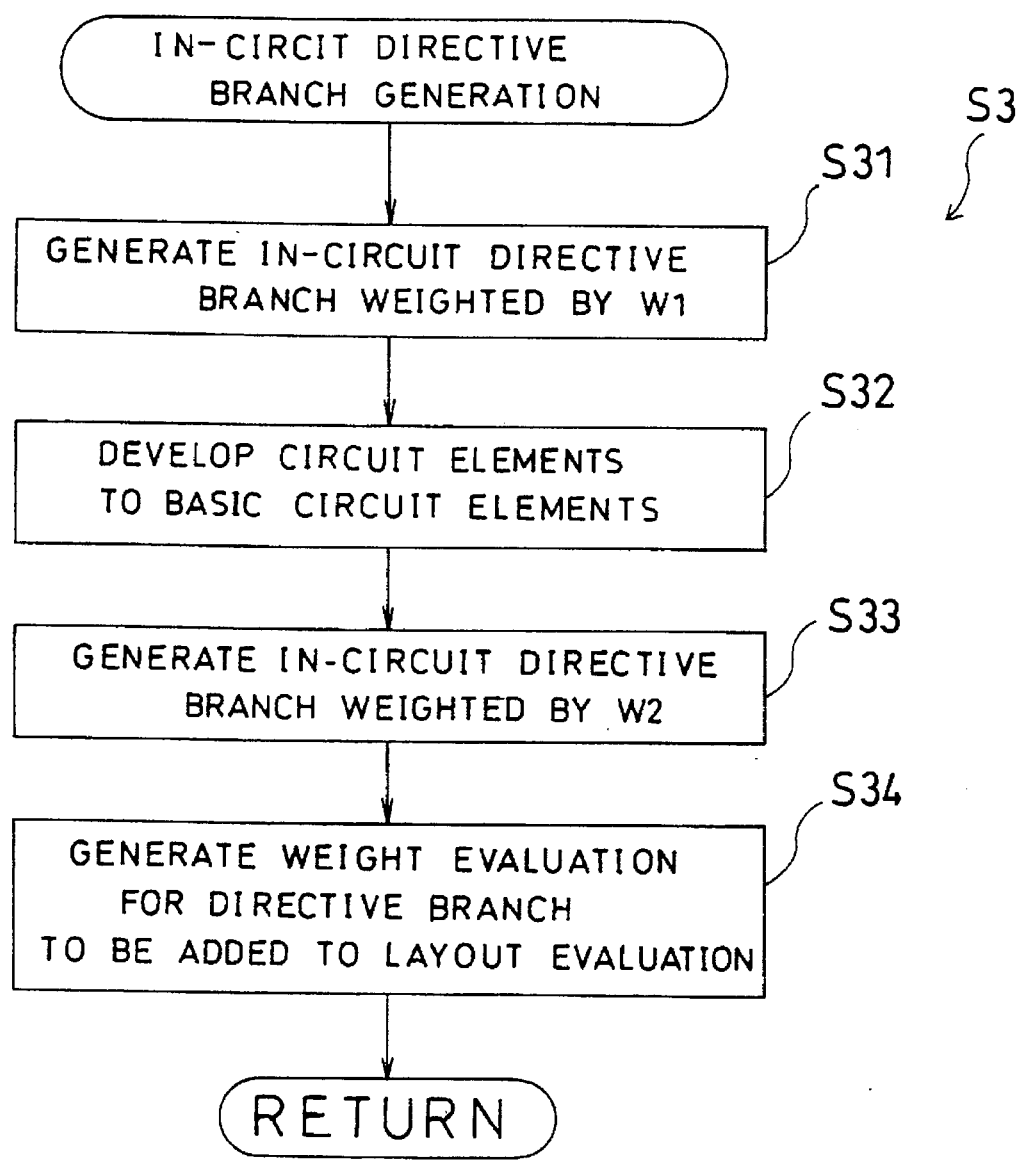
FIG. 7 is a flow chart showing details of an in-circuit directive branch generation processing of the data-path automatic layout method in accordance with the embodiment of the present invention.

Next, an external terminal directive layout processing (second processing) S2 is executed. This external terminal directive layout processing S2 is divided into an eternal terminal directive branch generation processing S21 and an external terminal directive branch convolution processing S22. The eternal terminal directive branch generation processing S21 produces an external terminal directive branch having a start point placed on input terminal group of the data-path logic circuit and an end point placed on output terminal group of the same, while the external terminal directive branch convolution processing S22 disposes the external terminal directive branch in a convoluting manner so that the input and output terminal groups are disposed at desired positions, as shown in FIG. 6.

Figure 10:
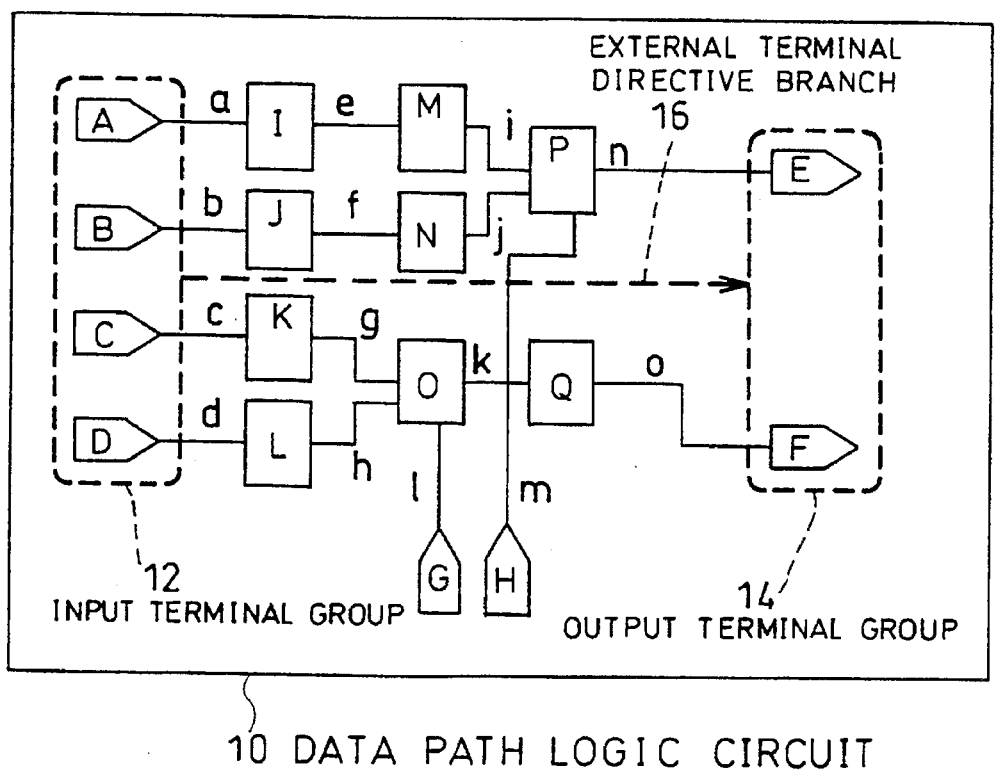
FIG. 10 is a view showing details of a data path logic circuit including an external terminal directive branch to be produced in the external terminal directive branch layout processing of the data-path automatic layout method in accordance with the embodiment of the present invention.
Figure 11:
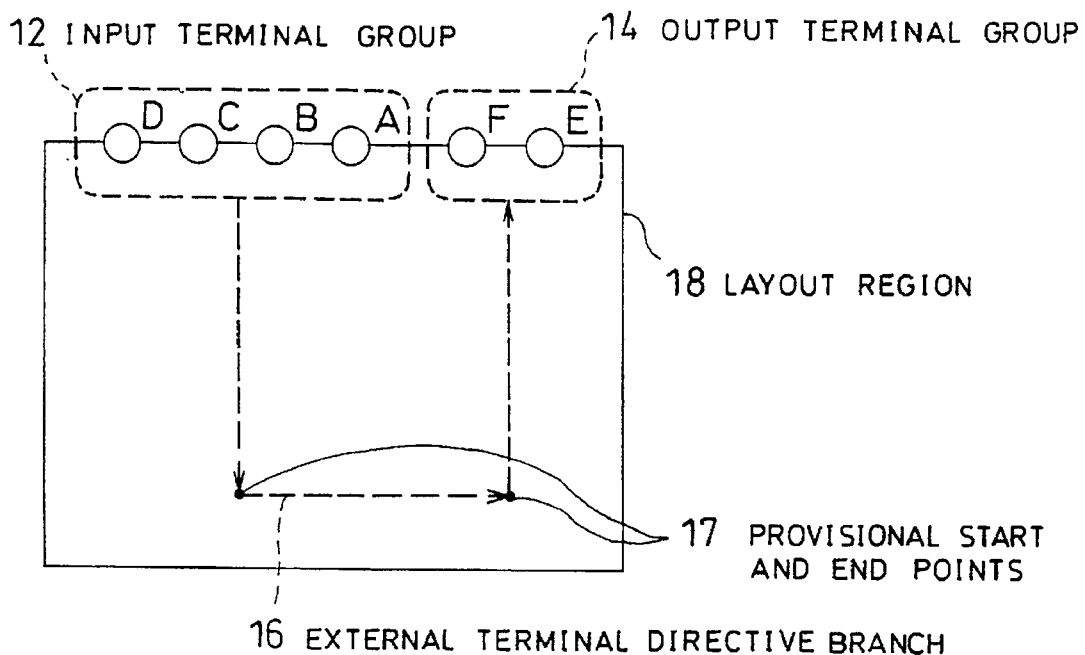
FIG. 11A is a view showing an external terminal directive branch comprising an input terminal group and an output terminal group both disposed on an upper side and provisional start and end points disposed along a convolution path.
FIG. 11B is a view showing an external terminal directive branch comprising an input terminal group disposed on an upper side and an output terminal group disposed on a lower side.
Figure 11:
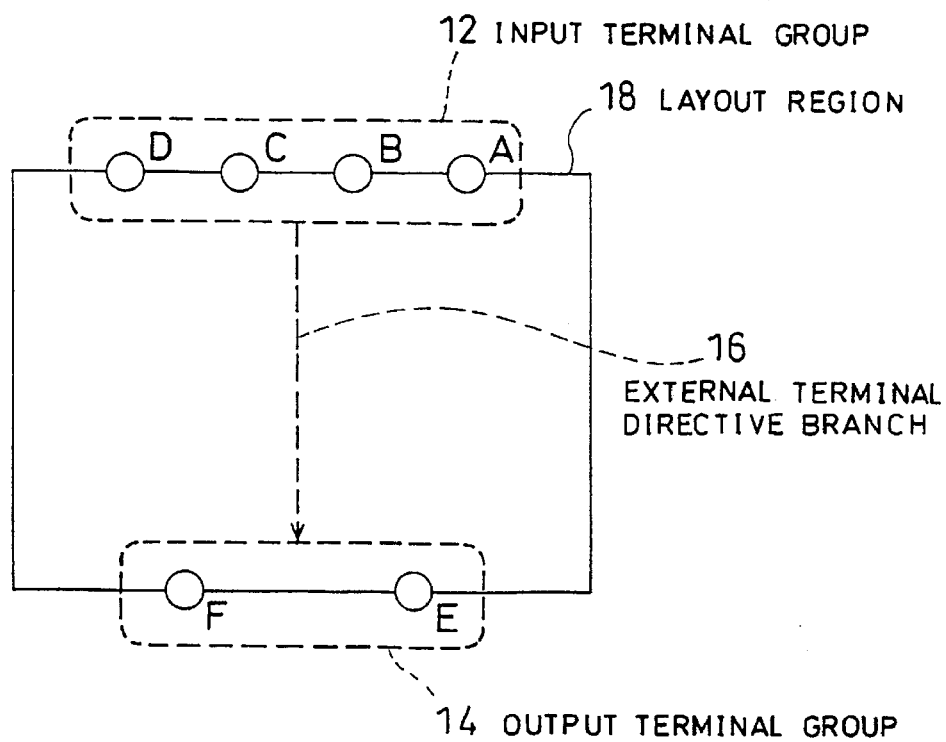

More specifically, in the processing S21, an external terminal directive branch 16 is produced by placing the start point on an input terminal group 12 consisting of input terminals A through D of the data-path logic circuit 10 and placing the end point on an output terminal group 14 consisting of output terminals E and F of the same circuit, as shown in FIG. 10. Next, in the processing S22, temporary start and end points are provided on the external terminal directive branch 16 in such a manner that both the input terminal group 12 and the output terminal group 14 serving as the start and end points are disposed on the upper side of a predetermined layout region 18, as shown in FIG. 11A. Thus, the external terminal directive branch 16 is disposed in a convoluting manner. For the purpose of simplifying the explanation, the following explanation assumes that the external terminal directive branch 16 has the input terminal group 12 disposed on the upper side of the layout region 18 and the output terminal group 14 disposed on the lower side of the same, as shown in FIG. 11B.

Thereafter, an in-circuit directive branch generation processing (third processing) S3 is executed. The in-circuit directive branch generation processing S3 comprises the following processes S31, S32, S33 and S34. The processing S31 produces first weighted in-circuit directive branches corresponding to respective connecting lines between any two circuit elements in the data-path logic circuit, each first weighted in-circuit directive branch having a start point placed on one circuit element supplying a signal to a related connecting line and an end point placed on the other circuit element receiving the signal from the same connecting line. The processing S32 develops a circuit element into basic circuit elements.

The processing S33 produces second weighted in-circuit directive branches corresponding to respective connecting lines between any two basic circuit elements in the data-path logic circuit, each second weighted in-circuit directive branch having a start point placed on one basic circuit element supplying a signal to a related connecting line and an end point placed on the other basic circuit element receiving the signal from the same connecting line. The processing S34 produces an evaluation for satisfying a requirement that a sum of lengths of in-circuit directive branches is minimized by taking account of the priority order based on the given weight.

Figure 12:
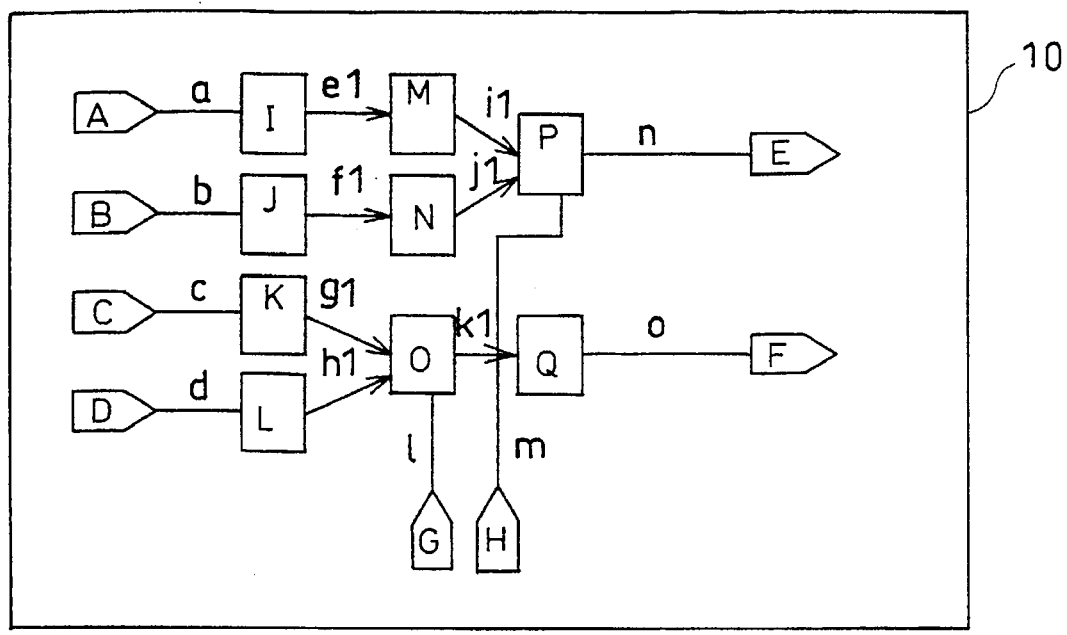
FIG. 12 is a view showing details of a data path logic circuit including in-circuit directive branches connecting circuit elements, produced in an in-circuit directive branch generation processing of the data-path automatic layout method in accordance with the embodiment of the present invention.

More specifically, in the processing S31, weighted in-circuit directive branches "e1" through "k1" are obtained by weighting the connecting lines "e" through "k" by the weight W1, as shown in FIG. 12. Each of the connecting lines "e" through "k" has a start point placed on one circuit element having an output terminal to be connected to the related connecting line and an end point placed on the other circuit element having an input terminal to be connected to the same connecting line. For example, the connecting line "i" is weighted by the weight W1 so as to be an in-circuit directive branch "i1", in such a manner that its start point is placed on a circuit element "M" having an output terminal to be connected to the connecting line "i", while its end point is placed on a circuit element "P" having an input terminal to be connected to the connecting line "i".

Figure 13:
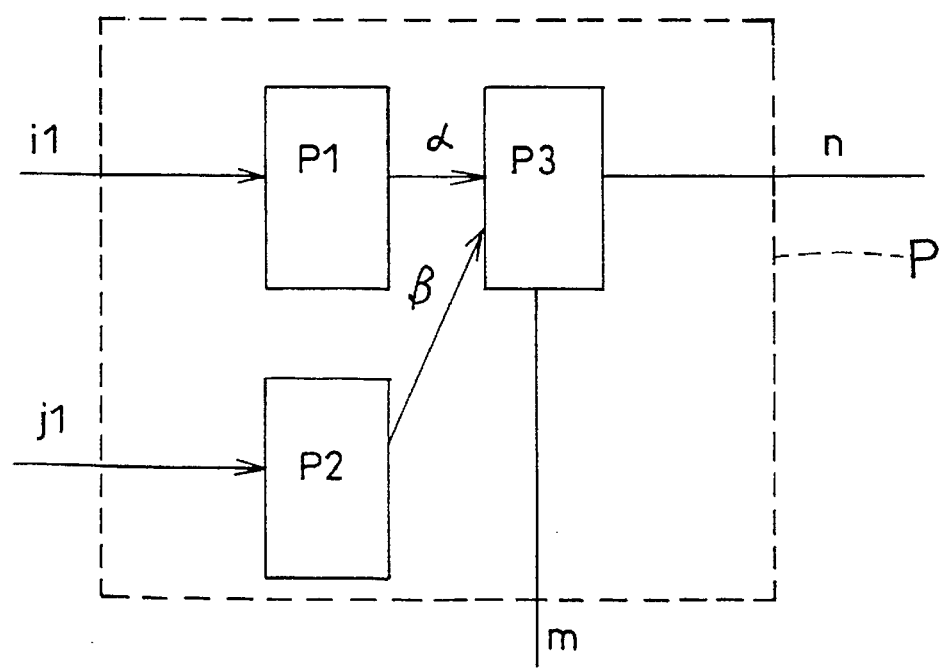
FIG. 13 is a view showing details of a circuit element developed into basic circuit elements in the in-circuit directive branch generation processing of the data-path automatic layout method in accordance with the embodiment of the present invention.

In the processing S32, as shown in FIG. 13, the circuit element "P" is developed into several basic circuit elements (AND, OR, NOR, etc) "P1" through "P3". In the same manner, the circuit element "0" is developed into basic circuit elements "01" through "03".

Figure 14:
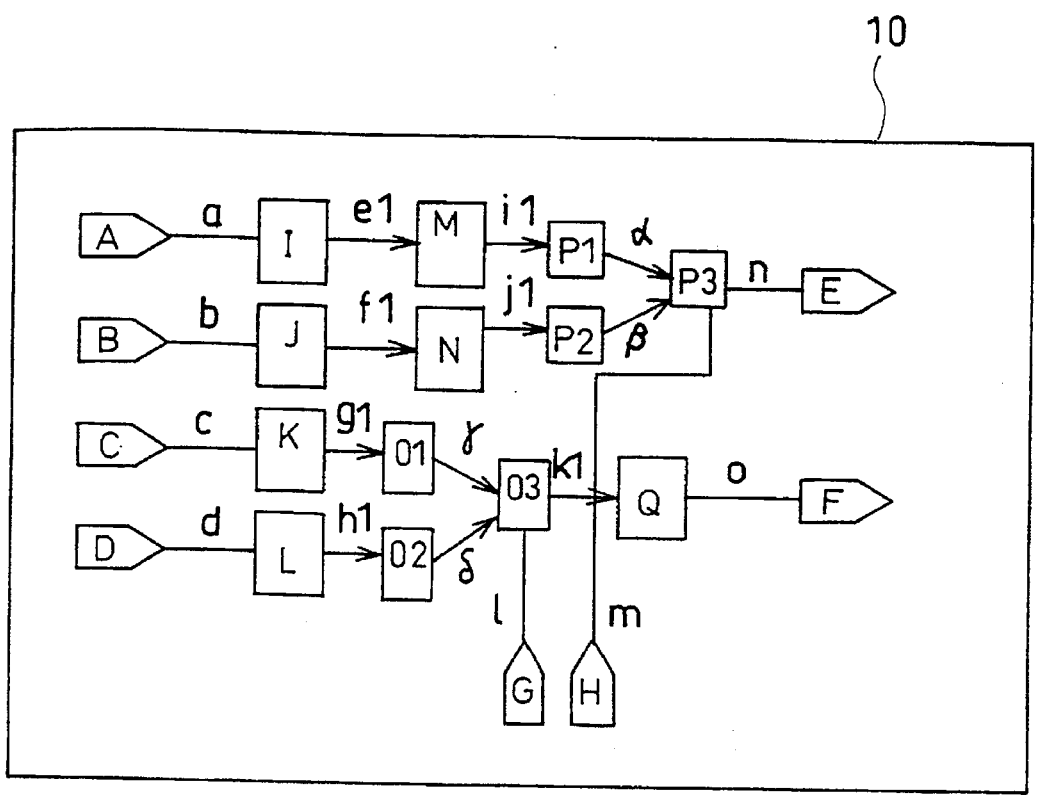
FIG. 14 is a view showing details of a data path logic circuit including in-circuit directive branches connecting basic circuit elements, produced in an in-circuit directive branch generation processing of the data-path automatic layout method in accordance with the embodiment of the present invention.

In the processing S33, weighted in-circuit directive branches "α" through "δ" are obtained by weighting respective connecting lines by the weight W2, as shown in FIG. 14. Each of the connecting lines "α" through "δ" has a start point placed on one basic circuit element having an output terminal to be connected to the related connecting line and an end point placed on the other basic circuit element having an input terminal to be connected to the same connecting line. For example, the connecting line between the basic circuit elements "P1" and "P3" is weighted by the weight W2 so as to be an in-circuit directive branch "α", in such a manner that its start point is placed on the basic circuit element "P1" having an output terminal to be connected to the connecting line, while its end point is placed on the other basic circuit element "P3" having an input terminal to be connected to the connecting line. The weight W2 is set to be heavier than the weight W1.

The last processing S34 produces an evaluation represented by the following formula (1) by considering the priority order that the weight W2 is heavier than the weight W1, in order to shorten the wiring length between basic circuit elements in each circuit element and guarantee the performance of each circuit element. The evaluation based on the formula (1) is added to a layout evaluation later explained.

$$f1 = \sum_{i=1}^{p} \{W(i) \cdot R(i)\} \quad (1)$$

where "p" represents a total number of in-circuit directive branches, W(i) represents a weight of an i-th in-circuit directive branch, and R(i) represents a wiring length of the i-th in-circuit directive branch (i.e. connecting line).

Figure 8:
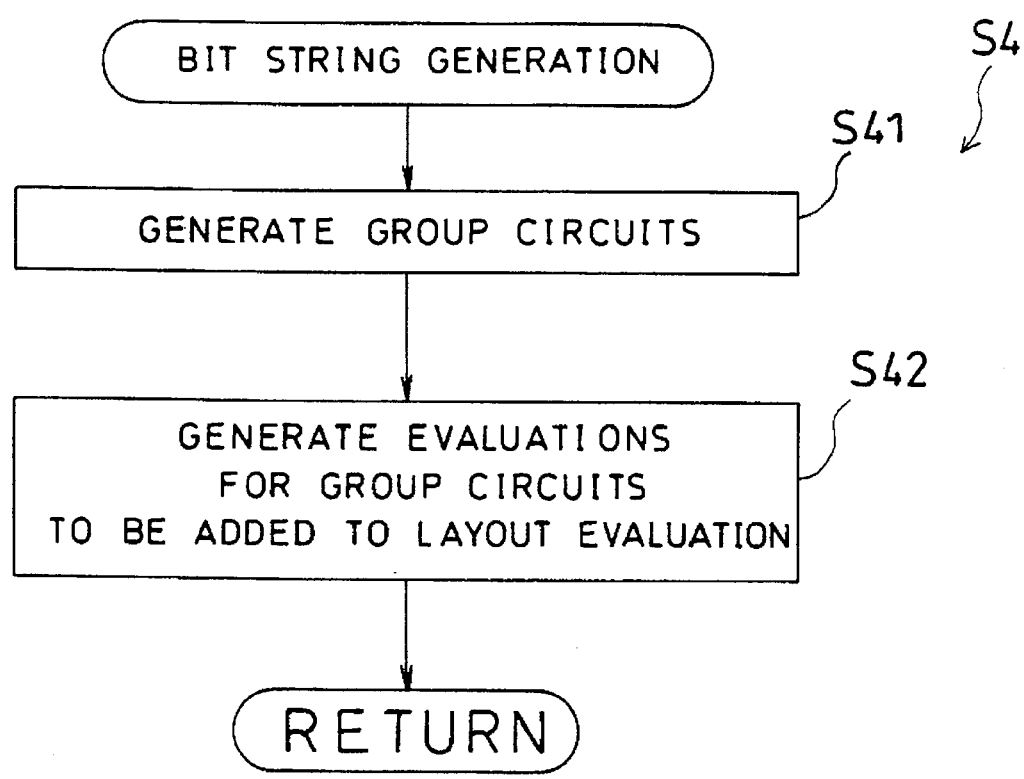
FIG. 8 is a flow chart showing details of a bit string generation processing of the data-path automatic layout method in accordance with the embodiment of the present invention.

Subsequently, a bit string generation processing (fourth processing) S4 is executed. The bit string generation processing S4 comprises the following processes S41 and S42 as shown in FIG. 8. The processing S41 searches pairs of circuit elements by which all the in-circuit directive branches having their start points on one circuit element or the like (including a basic circuit element) are completely met with all the in-circuit directive branches having their end points on the other circuit element or the like, and constitutes a group circuit of bit strings based on thus obtained pairs of the circuit elements or the like.

The processing S42 produces an evaluation for satisfying a requirement that circuit elements or the like belonging to the same group circuit are disposed adjacently.

Figure 15:
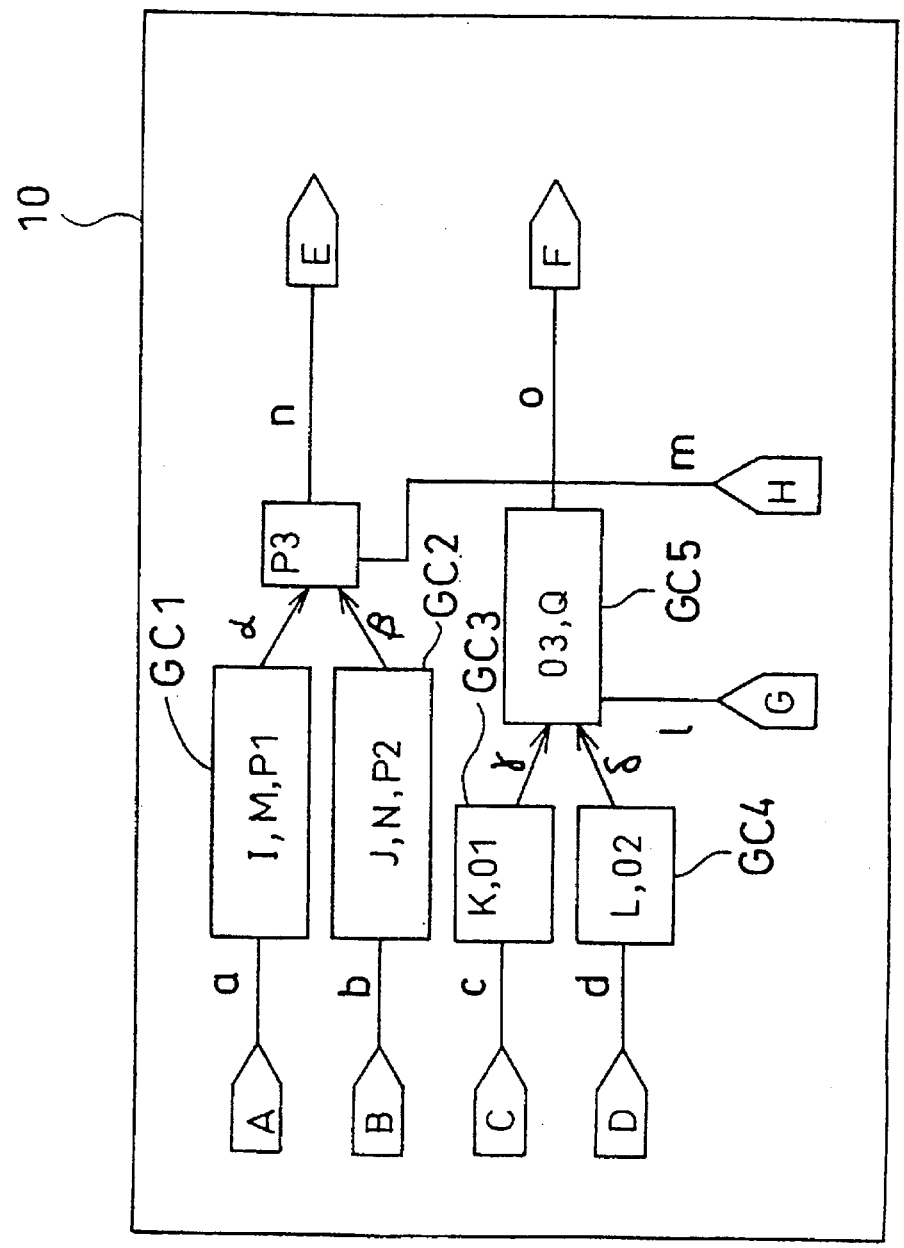
FIG. 15 is a view showing details of a data path logic circuit including group circuits of bit string, produced in the bit string generation processing of the data-path automatic layout method in accordance with the embodiment of the present invention.

More specifically, as shown in FIG. 14, the processing S41 finds out the relation that an in-circuit directive branch having its start point on a circuit element "I" is completely met with an in-circuit directive branch having its end point on a circuit element "M" (in this case, the common in-circuit directive branch is "e1"), and designates these circuit elements "I" and "M" as selected pairs of circuit elements. The similar relationship is found in the relationship between the circuit elements "M" and the basic circuit element "P1". Then, as shown in FIG. 15, thus found out circuit elements "I", "M" and the basic circuit elements "P1" are integrated into one circuit element regarded as a group circuit "GC1" of bit string.

Similarly, circuit elements "J", "N" and the basic circuit element "P2" are integrated into one group circuit "GC2". Circuit element "K" and the basic circuit element "O1" are integrated into one group circuit "GC3". Circuit element "L" and the basic circuit element "O2" are integrated into one group circuit "GC4" And, basic circuit element "O3" and circuit element "Q" are integrated into one group circuit "GC5".

Then, the processing S42 produces an evaluation for satisfying a requirement that circuit elements or the like (including basic circuit elements) belonging to the same group circuit are disposed adjacently, so the circuit elements "I", "M" and the basic circuit element "P1" belonging to the same group circuit "GC1" are disposed adjacently.

Next, a layout evaluation formula generation processing (fifth processing) S5 produces an overall layout evaluation formula, which comprises the formula (1) evaluation obtained in the in-circuit directive branch generation processing S3, the evaluation produced in the bit string generation processing S4, the evaluation for satisfying the requirement that directions of in-circuit directive branches "e1" through "k1" and "α" through "δ" are equalized with the direction of the external terminal directive branch 16 for maintaining a flow of data representing characteristics of the data-path logic circuit 10, and ordinary layout evaluations (wiring length, congestion evaluation and so on).

The evaluation for satisfying the requirement that directions of in-circuit directive branches "e1" through "k1" and "α" through "δ" are equalized with the direction of the external terminal directive branch 16 can be expressed by the following equation (2).

$$f2 = \sum_{i=1}^{p} \{V(i) \cdot V0\} \quad (2)$$

where "p" represents a total number of in-circuit directive branches, VO represents a vector corresponding to the external terminal directive branch 16 in the layout region 18, and V(i) represents a vector corresponding to i-th directive branch among the in-circuit directive branches "e1" through "k1" and "α" through "δ". In short, the formula (2) obtains a sum of inner products between each in-circuit directive branch and the external terminal directive branch 16.

Figure 16:
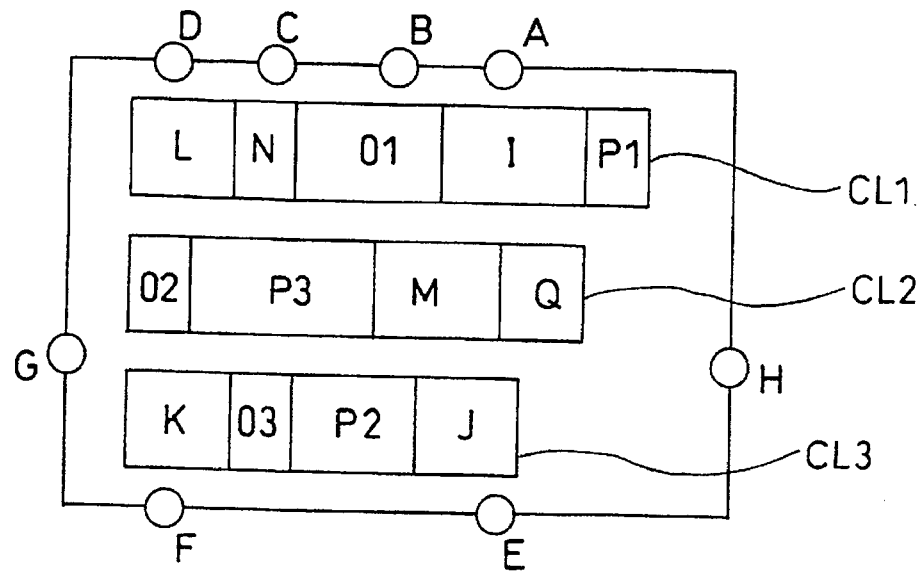
FIG. 16 is a view showing an initial layout prior to execution of a layout optimization processing of the data-path automatic layout method in accordance with the embodiment of the present invention.

Thereafter, a layout optimization processing (sixth processing) S6 obtains an optimum layout capable of minimizing the value of the overall layout evaluation formula produced in the layout evaluation formula generation process S5 based on an initial layout arbitrarily arranged, as shown in FIG. 16. In this case, a conventionally proposed method, such as pair exchange method, can be used for the optimization in the layout optimization processing S6. The pair exchange method is characterized by the processes of selecting two elements at random, comparing the layout evaluation results before and after the selected two elements are exchanged or one is transferred to the other, and settling the exchange or transfer attempted when an improvement is recognized in the layout evaluation result or canceling the same when no improvement is recognized, these processes being repeatedly executed.

Figure 17:
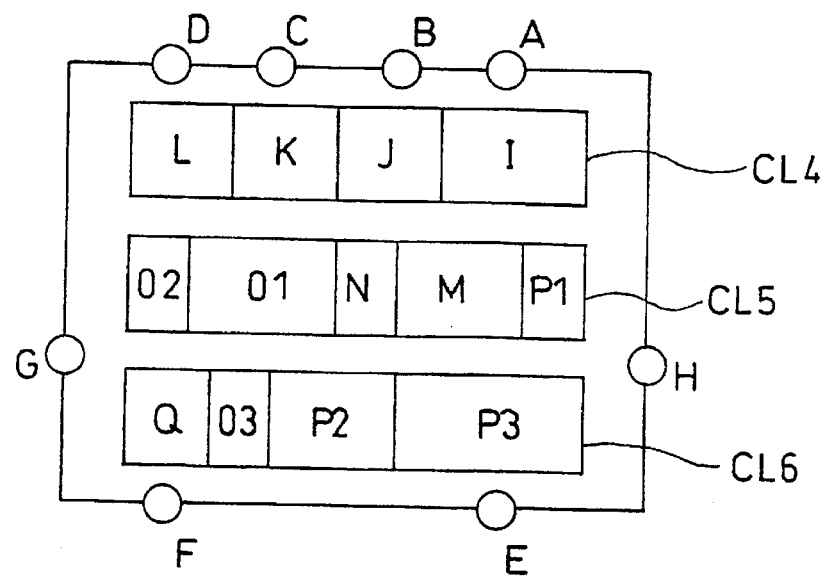
FIG. 17 is a view showing a resultant layout after execution of the layout optimization processing of the data-path automatic layout method in accordance with the embodiment of the present invention.

FIG. 17 shows a finally obtained layout result having been improved. In the drawing, standard cells are used as physical elements equivalent to circuit elements and basic circuit elements. Terminal positions are strictly determined from the connecting line relation whose layout has been improved. Disposed positions of the control terminals "G" and "H" are automatically allocated to adjacent sides of the layout region. By the way, in FIGS. 16 and 17, "CL1" through "CL6" represent rows of cells.

Finally, a layout output processing (seventh processing) S7 produces a finalized layout result and completes the layout processing.

Figure 18:
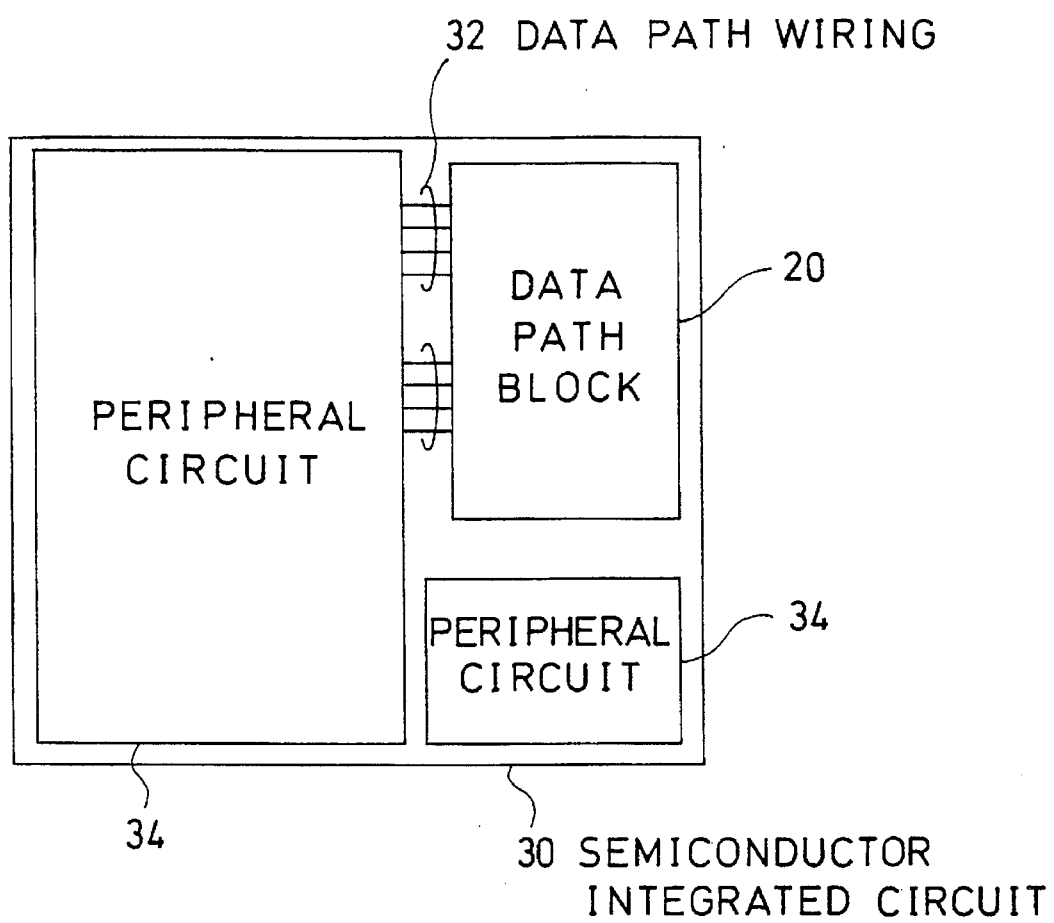
FIG. 18 is a view showing an overall layout of a semiconductor integrated circuit realized by the data-path automatic layout method in accordance with the embodiment of the present invention.
Figure 19:
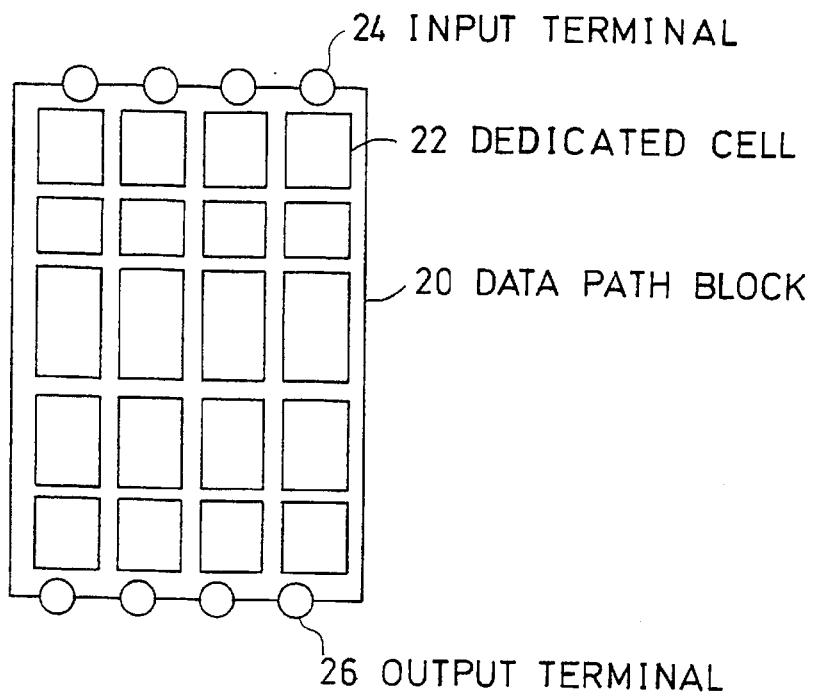
FIG. 19A is a view showing a layout resultant from a conventional data-path automatic layout method, wherein a bit number of each signal is constant in a data-path logic circuit.
FIG. 19B is a view showing another layout resultant from a conventional data-path automatic layout method, wherein the bit number of each signal is varied in a data-path logic circuit.
Figure 19:
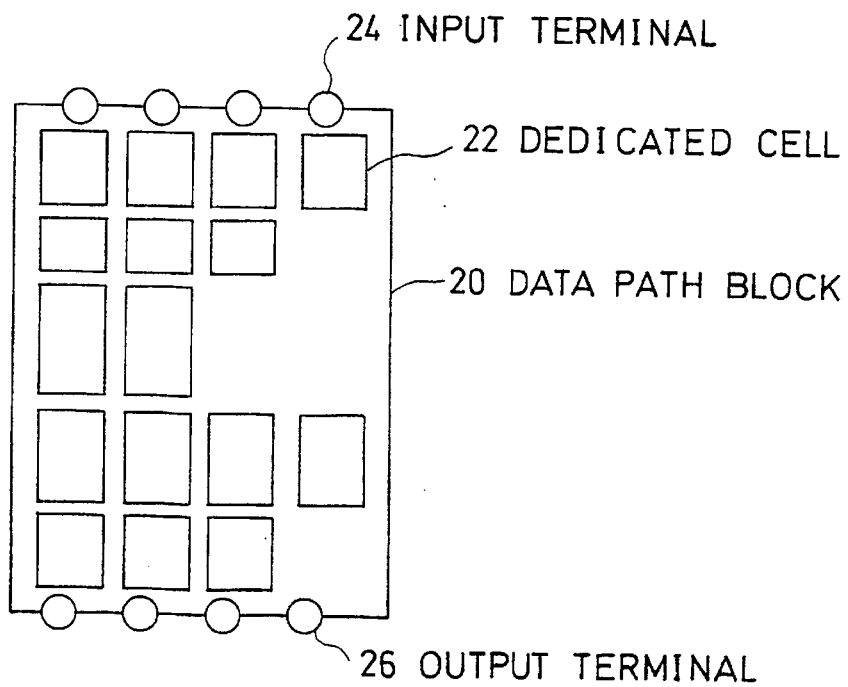
Figure 20:
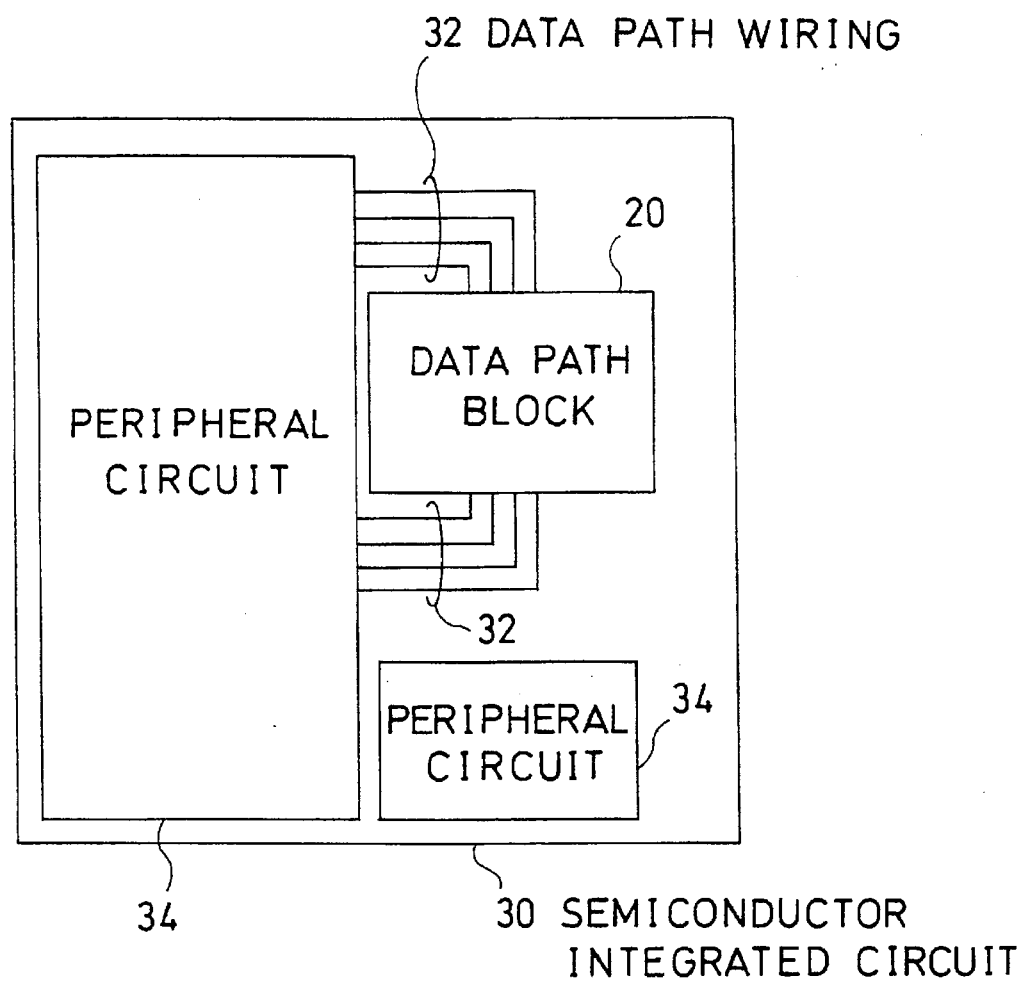
FIG. 20 is a view showing an overall layout of a semiconductor integrated circuit realized by a conventional data-path automatic layout method.

As explained above, the present embodiment enables us to flexibly change the positions of terminals. Therefore, when compared with the conventional arrangement shown in FIG. 20, an entire area of the semiconductor integrated circuit can be fairly reduced as shown in FIG. 18. Thus, it becomes possible to obtain a data-path layout excellent in the area efficiency.

Although the present embodiment adopts a special data-path logic circuit as an input, it is needless to say that the present embodiment can be applied to a general data-path logic circuit used in an ordinary semiconductor integrated circuit.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A data-path automatic layout method for automatically arranging circuit elements of a data-path logic circuit on a semiconductor substrate using memory and arithmetic functions of a computer, said data-path logic circuit processing data signals of plural bits, said method comprising:

a first processing for inputting said data-path logic circuit;

a second processing for producing a first directive branch having a start point placed on an input terminal group of said data-path logic circuit inputted by said first processing and an end point placed on an output terminal group of said data-path logic circuit, said input terminal group comprising a plurality of input terminals inputting said data signals of plural bits and said output terminal group comprising a plurality of output terminals;

a third processing for producing second directive branches corresponding to respective connecting lines between two circuit elements in the data-path logic circuit inputted in said first processing, each second directive branch having a start point placed on one circuit element supplying a signal to a related connecting line and an end point placed on the other circuit element receiving the signal from the same connecting line;

a fourth processing for producing a plurality of circuit element groups corresponding to said data signals of plural bits, using said second directive branches produced in said third processing;

a fifth processing for producing a layout evaluation including an evaluation for satisfying a requirement that a direction of said first directive branch produced in said second processing is met with directions of said second directive branches produced in said third processing;

a sixth processing for optimizing a layout of circuit elements of said data-path logic circuit inputted in said first processing based on said layout evaluation produced in said fifth processing; and a seventh processing for outputting an optimum layout result obtained through optimization by said sixth processing.

2. The data-path automatic layout method defined by claim 1, wherein said second processing comprises a processing for setting said input terminal group of said data-path logic circuit as said start point of said first directive branch, and setting said output terminal group of said data-path logic circuit as said end point of said first directive branch; and a processing for providing provisional start and end points on said first directive branch for disposing said first directive branch in a convoluting manner, so that said input terminal group and said output terminal group are disposed at desired positions on said semiconductor substrate.

3. The data-path automatic layout method defined by claim 1, wherein said third processing comprises a process for producing first weighted directive branches, as said second directive branches, corresponding to respective connecting lines between two circuit elements in said data-path logic circuit, each first weighted directive branch having a start point placed on one circuit element supplying a signal to a related connecting line and an end point placed on the other circuit element receiving the signal from the same connecting line;

a processing for developing said circuit element into a plurality of basic circuit elements such as AND and OR circuits;

a processing for producing second weighted directive branches corresponding to respective connecting lines between said basic circuit elements, each second weighted directive branch having a start point placed on one basic circuit element supplying a signal to a related connecting line and an end point placed on the other basic circuit element receiving the signal from the same connecting line; and a processing for producing an evaluation satisfying a requirement that a sum of lengths of said second directive branches is minimized by taking account of priority order based on weight of each second directive branch, the evaluation thus produced being added to said layout evaluation produced in said fifth processing.

4. The data-path automatic layout method defined by claim 1, wherein said fourth processing comprises a processing for finding out circuit elements satisfying a relation that all of second directive branches having a start point placed on one circuit element of said data-path logic circuit are completely met with all of second directive branches having an end point placed on another circuit element of said data-path logic circuit, and then constituting said circuit element groups by said circuit elements satisfying said relation; and a processing for producing an evaluation satisfying a requirement that circuit elements belonging to a same circuit element group are disposed adjacently, the evaluation thus produced being added to said layout evaluation produced in said fifth processing.

5. A data-path automatic layout apparatus for automatically arranging circuit elements of a data-path logic circuit on a semiconductor substrate using memory and arithmetic functions of a computer, said data-path logic circuit processing data signals of plural bits, said apparatus comprising:

first means for inputting said data-path logic circuit;

second means for producing a first directive branch having a start point placed on an input terminal group of said data-path logic circuit inputted by said first means and an end point placed on an output terminal group of said data-path logic circuit, said input terminal group comprising a plurality of input terminals inputting said data signals of plural bits and said output terminal group comprising a plurality of output terminals;

third means for producing second directive branches corresponding to respective connecting lines between two circuit elements in the data-path logic circuit inputted by said first means, each second directive branch having a start point placed on one circuit element supplying a signal to a related connecting line and an end point placed on the other circuit element receiving the signal from the same connecting line;

fourth means for producing a plurality of circuit element groups corresponding to said data signals of plural bits, using said second directive branches produced by said third means;

fifth means for producing a layout evaluation including an evaluation for satisfying a requirement that a direction of said first directive branch produced by said second means is met with directions of said second directive branches produced by said third means;

sixth means for optimizing a layout of circuit elements of said data-path logic circuit inputted by said first means based on said layout evaluation produced by said fifth means; and seventh means for outputting an optimum layout result obtained through optimization by said sixth means.

6. The data-path automatic layout apparatus defined by claim 5, wherein said second means comprises means for setting said input terminal group of said data-path logic circuit as said start point of said first directive branch, and setting said output terminal group of said data-path logic circuit as said end point of said first directive branch; and means for providing provisional start and end points on said first directive branch for disposing said first directive branch in a convoluting manner, so that said input terminal group and said output terminal group are disposed at desired positions on said semiconductor substrate.

7. The data-path automatic layout method defined by claim 5, wherein said third means comprises means for producing first weighted directive branches, as said second directive branches, corresponding to respective connecting lines between two circuit elements in said data-path logic circuit, each first weighted directive branch having a start point placed on one circuit element supplying a signal to a related connecting line and an end point placed on the other circuit element receiving the signal from the same connecting line;

means for developing said circuit element into a plurality of basic circuit elements such as AND and OR circuits;

means for producing second weighted directive branches corresponding to respective connecting lines between said basic circuit elements, each second weighted directive branch having a start point placed on one basic circuit element supplying a signal to a related connecting line and an end point placed on the other basic circuit element receiving the signal from the same connecting line; and means for producing an evaluation satisfying a requirement that a sum of lengths of said second directive branches is minimized by taking account of priority order based on weight of each second directive branch, the evaluation thus produced being added to said layout evaluation produced by said fifth means.

8. The data-path automatic layout apparatus defined by claim 5, wherein said fourth means comprises means for finding out circuit elements satisfying a relation that all of second directive branches having a start point placed on one circuit element of said data-path logic circuit are completely met with all of second directive branches having an end point placed on another circuit element of said data-path logic circuit, and then constituting said circuit element groups by said circuit elements satisfying said relation; and means for producing an evaluation satisfying a requirement that circuit elements belonging to a same circuit element group are disposed adjacently, the evaluation thus produced being added to said layout evaluation produced by said fifth means.

* * * * *